(12) United States Patent
Grewe et al.

(10) Patent No.: US 6,239,502 B1
(45) Date of Patent: May 29, 2001

(54) PHASE CHANGE ASSISTED HEAT SINK

(75) Inventors: Timothy Michael Grewe; Steve William Osovski, both of Endicott, NY (US)

(73) Assignee: BAE Systems Controls

( * ) Notice: Subject to any disclaimer, the term of this patent is extended or adjusted under 35 U.S.C. 154(b) by 0 days.

(21) Appl. No.: 09/444,097

(22) Filed: Nov. 22, 1999

(51) Int. Cl.[7] .................................................. B60K 11/00
(52) U.S. Cl. ............................................ 290/1 B; 361/700
(58) Field of Search ..................................... 361/700, 701, 361/702, 704; 62/3.61; 180/65.2; 290/1 R, 1 A, 1 B, 2

(56) References Cited

U.S. PATENT DOCUMENTS

| | | | |
|---|---|---|---|
| 4,665,319 | * 5/1987 | Seepe et al. | 290/3 |
| 4,733,331 | * 3/1988 | Chauvet | 361/385 |
| 5,253,613 | * 10/1993 | Bailey et al. | 123/41.31 |
| 5,255,733 | * 10/1993 | King | 165/39 |
| 5,291,960 | * 3/1994 | Brandenburg et al. | 180/65.2 |
| 5,392,741 | * 2/1995 | Uzkan | 123/41.13 |
| 5,531,285 | * 7/1996 | Green | 180/65.2 |
| 5,586,004 | * 12/1996 | Green et al. | 361/699 |
| 5,828,201 | * 10/1998 | Hoffman, Jr. et al. | 320/104 |
| 5,929,595 | * 7/1999 | Lynos et al. | 320/104 |
| 5,941,328 | * 8/1999 | Lynos et al. | 180/65.1 |
| 5,950,752 | * 9/1999 | Lyons | 180/65.2 |
| 5,998,885 | * 12/1999 | Tamor et al. | 307/10.1 |

* cited by examiner

Primary Examiner—Nicholas Ponomarenko
(74) Attorney, Agent, or Firm—M. H. Meise; G. H. Krauss

(57) ABSTRACT

In an electric vehicle, the traction motor is driven from a battery by way of a controllable electric power switching arrangement. In normal operation of the switches of the switching arrangement, the power losses or heating of the switches depends upon the power being handled; during hard acceleration the power is high, and at constant speed on level ground the power is relatively small. Thus, the power "dissipated" by the switches varies with time. A cooling system transfers heat from the switching arrangement to ambient. During acceleration, the cooling system may not be able to limit the instantaneous temperature of the switches to the desired value. A phase-change heat "sink" coupled to the switches absorbs heat from the switches during hard acceleration, and returns the heat to the cooling system under more constant-speed conditions. In general, any electronic device which experiences transient power surges may use the same principle, thereby allowing the overall cooling system to be sized for average power, with the phase-change sink acting as an "integrator" to average the power by storing heat when the temperature tends to rise, and returning the heat when the temperature tends to fall. In an electric vehicle, braking is accomplished by returning energy to the battery, but when the battery is fully charged and can accept no more charge, braking may be accomplished by coupling the electric power to a cooled phase-change sink. The phase-change material may be iron.

5 Claims, 10 Drawing Sheets

PHASE CHANGE ASSISTED HEAT SINK

FIELD OF THE INVENTION

This invention relates to the cooling of power electronic components, and more particularly to the use of phase-change heat transducers to aid in such cooling.

BACKGROUND OF THE INVENTION

Modern electrically driven power machines such as industrial and domestic air conditioners, electrical and hybrid-electric vehicles, and the like, are controlled in more sophisticated manners than in the past. More particularly, many such power machines are driven from sources which synthesize the electrical drive waveforms in order to provide improved efficiency and performance by comparison with simple on-off application of the raw source energy. For example, in the traction motor drive of an electrical vehicle energized at least in part from a direct-voltage battery (also known as a direct-current or DC battery), high efficiency and controllability is attainable by using a multiphase alternating-voltage motor operated in a field-oriented control mode. A controllable switched electrical converter/inverter converts the direct voltage from the battery (or other source) into three-phase alternating voltage or current for driving the traction motor.

Hybrid electric vehicles are widely viewed as being among the most practical of the low-polluting vehicles. A hybrid electric vehicle includes an electric "traction" battery which provides electric power for an electric traction motor, which in turn drives the wheels of the vehicle. The "hybrid" aspect of a hybrid electric vehicle lies in the use of a secondary or supplemental source of electrical energy for recharging the traction battery during operation of the vehicle. This secondary source of electrical energy may be solar panels, a fuel cell, a generator driven by an internal combustion engine, or generally any other source of electrical energy. When an internal combustion engine is used as the secondary source of electrical power, it commonly is a relatively small engine which uses little fuel, and produces little pollution. A concomitant advantage is that such a small internal combustion engine can be operated within a limited RPM range, so that pollution controls of the engine may be optimized. The terms "primary" and "secondary" when used to describe the sources of electrical energy merely relate to the way energy is distributed during operation, and are not of fundamental importance. A simple electrically driven vehicle powered only by electrical batteries has the disadvantages that the batteries may become depleted while the vehicle is far from a battery charging station, and even when such a vehicle successfully returns to its depot after a day's use, the batteries must then be recharged. The hybrid electric vehicle has the significant advantage over a simple electrically powered vehicle that the hybrid electric vehicle recharges its own batteries during operation, and so should not ordinarily require any external battery charging. Thus, the hybrid electric vehicle can be used much like an ordinary vehicle powered by internal combustion engines, requiring only replenishing of the fuel.

Another major advantage of the hybrid electric vehicle is its good fuel mileage. The advantage in fuel mileage arises from the use of regenerative dynamic braking, which converts kinetic energy of motion into electrical power during at least a portion of braking, and returns the energy to the battery. It has been found that braking losses account for somewhere near half of all the frictional losses experienced by a vehicle in an urban transit setting. The recovery of this 50% of energy, and returning it to the batteries for further use, permits the use of a much smaller "secondary" fuel-operated electrical generator than would be the case if regenerative braking were not used. In turn, the smaller secondary electrical source results in less fuel used per unit time, or per mile. Yet another advantage of a hybrid electric vehicle is that under many conditions, the power which is available for accelerating the vehicle is the sum of the maximum power which can be supplied by the batteries plus the maximum power which can be generated by the secondary electrical generator. When the electrical generator is a diesel-powered internal combustion engine, the combination of the battery power and the diesel power can result in a total motive force which is quite substantial, notwithstanding the good fuel mileage.

In FIG. 1, an electric vehicle 10, as described in U.S. Pat. No. 5,929,595, issued Jul. 27, 1999 in the name of Lyons et al., includes at least one drive wheel 12 connected to an alternating voltage electric traction motor 40, which in one embodiment is a three-phase alternating-current motor. Motor 40 is preferably a motor-generator, as known, so that kinetic energy of motion can be transduced into electrical energy during dynamic braking. A power controller 14 is connected by power-handling paths to traction motor 40, to a traction battery illustrated as 20, and to an auxiliary source of electrical energy illustrated as a block 16. As illustrated in block 16, the auxiliary source may include an internal combustion engine such as a diesel engine 18 driving an electrical generator 22, or it may include a fuel cell 24. A command controller illustrated as a block 50 is connected by means of information paths to power controller 14, auxiliary source 16, and to traction motor 40, for controlling the operation of the power controller 14, auxiliary source 16, and to traction motor 40 in accordance with appropriate control laws.

One of the most common and least expensive types of batteries which is capable of storing relatively high power includes the common lead/$H_2SO_4$ battery. This type of battery is suitable for use in an electric vehicle, if some care is taken to prevent application of a charging current thereto when the battery is at full charge, to prevent gassing of the electrolyte and undesired heat generation, and if sulfation can be avoided. U.S. Pat. No. 5,828,201, issued Oct. 27, 1998 in the name of Hoffman, Jr., et al., and entitled METHOD FOR EQUALIZING THE VOLTAGE OF TRACTION BATTERY MODULES OF A HYBRID ELECTRIC VEHICLE, and U.S. Pat. No. 5,869,950, issued Feb. 9, 1999, also in the name of Hoffman, Jr., et al., and entitled METHOD FOR MAINTAINING THE CHARGE CAPACITY OF TRACTION BATTERY MODULES OF A HYBRID ELECTRIC VEHICLE, describe control arrangements by which lead-acid batteries can be maintained to optimize their useful life and capacity, and describe various aspects of the care and use of such batteries.

FIG. 1, the displays and operator controls of vehicle 10 are illustrated as a block 30. Block 30 is illustrated as being connected by a bidirectional data path 31 to command control block 50, for applying driving commands to command controller 50, which command controller 50 can then convert into appropriate commands to the various power elements, such as power controller 14, auxiliary source 16, and traction motor 40. Block 30 is also illustrated as being connected by a path 32 to friction brakes 36a and 36b, for direct control of the friction brakes by a conventional hydraulic braking system connected to a brake pedal.

FIG. 2 represents the interconnection of some of the elements of power controller 14 of FIG. 1 with other elements of FIG. 1. More particularly, power controller 14 includes a rectifier arrangement 26 connected to auxiliary source 16, for (if necessary) converting alternating-current output of the auxiliary source 16 into direct voltage. Power controller 14 also includes a bidirectional propulsion control system, which further includes a dc-to-ac inverter 28 coupled by power connections to battery 20, to rectifier arrangement 26, and to traction motor 40. The operations of the inverter 28, the auxiliary source 16, and traction motor 40 are controlled, as mentioned above, by command controller 50. It should be noted that in addition to the dc-to-ac inverter 28, the propulsion control system includes voltage and current sensors, to sense the various operating parameters of the motor/generator, battery, and auxiliary electrical source.

In basic operation of the arrangement of FIGS. 1 and 2, the command controller (50) controls the individual switches (not illustrated) of inverter 28 with pulse-width-modulated commands, which result in the generation, at that port 28m of the inverter 28 which is coupled to the traction motor 40, of an approximation of an alternating voltage having a selected frequency and magnitude. In a preferred version, the inverter is a field oriented command (FOC) type, and traction motor is similarly an FOC induction motor. The frequency and magnitude of the commanded alternating current drive to the traction motor 40 are selected to drive the motor with a selected traction current at a selected motor speed. In general, traction motor 40 produces a back EMF which increases with increasing motor speed, and the inverter must produce (under the control of command controller 50) an alternating voltage which increases in magnitude with increasing alternating voltage frequency in order to maintain the same traction motor drive current. The motor rotates at a frequency consistent with the commanded frequency of the inverter output. Also in basic operation of an electric vehicle such as that of FIGS. 1 and 2, both dynamic braking and friction braking may be performed. The dynamic braking is much preferred, as the (kinetic) energy inherent in the motion of the vehicle is recaptured, by the traction motor operating as an electric generator, as the vehicle is slowed. During those intervals in which dynamic braking occurs, the dc-to-ac inverter 28 of FIG. 2, operating in a second or regenerating direction, converts the alternating voltage produced by the traction motor 40 into a direct voltage which charges traction battery 20. Further, when the electric vehicle is a hybrid electric vehicle, including the auxiliary electric source 16, the auxiliary source can be operated during operation of the vehicle to replenish the batteries andor to provide some of the traction energy, depending upon the commands of command controller 50.

It has been noticed that, when an electric vehicle is operated in a normal mode using dynamic braking, and the batteries are fully charged, the dynamic braking tends to push a charge current through the already-charged battery. The characteristics of a lead-acid battery are such that, in this situation of applying a charging current to a fully charged battery, the battery voltage tends to rise markedly, as from a fully charged, no-current value of 13 volts, in a nominally 12-volt battery, to somewhere near 16 volts, thereby providing an indication to the command controller that an overcharging condition is occurring. If the command controller decouples the energy generated by dynamic braking from the battery, as it must in order to protect the battery, the battery voltage immediately drops to its fully-charged no-current value. This, in turn, allows the dynamic braking controller to once again begin to provide energy to the battery until the overvoltage control takes effect. This results in periodic application of the dynamic braking at a pulse rate established by the loop characteristics of the command controller, and produces a perceivable braking chatter, as well as tending to overcharge the battery during portions of the pulse interval. Both the overcharging and the chatter are undesirable.

FIGS. 3a and 3b together illustrate a control law as described in U.S.]], which allows full regeneration or return to the traction batteries of energy derived from dynamic braking during those intervals in which the traction batteries are at a state of charge less than a particular amount of charge, which particular amount of charge is less than full charge, and which, at traction battery charge levels lying between the particular charge and full charge, tapers the proportion of the regenerated energy derived from dynamic braking in a manner which is responsive or a function of the then-existing state of charge relative to the difference in charge between the predetermined charge and full charge. In one embodiment, the relationship is monotonic, and the relationship may be linear. In FIG. 3a, plot 310 represents the amount of regeneration as a function of traction battery charge state pursuant to a control law. More particularly, plot 310 defines a portion 312 which is constant at a value of dynamic braking regeneration which represents 100% regeneration, or as close to 100% as is conveniently possible. At full charge, the amount of regeneration of the energy derived from dynamic braking is reduced to near zero, or as close to zero as is conveniently possible. The control law represented by plot 310 further includes a second portion 314, which ramps monotonically from 100% regeneration at a predetermined traction battery charge level denominated "first charge" to zero regeneration at full charge of the traction battery. The effect on the regenerative traction or braking of the vehicle as a function of traction battery charge condition is illustrated by a plot 320 in FIG. 3b. In FIG. 3b, plot 320 includes a first portion 322, which extends at a constant value representing maximum regenerative traction from low charge levels to the "first" level of charge of the traction battery. A second portion 324 of plot 320 represents regenerative traction which ramps monotonically from 100% at the "first" charge level to 0% at full charge. While the portions 314 and 324 of plots 310 and 320, respectively, are illustrated as linear ramps, it is sufficient for control purposes that the portions 314 and 324 be monotonic. This monotonic reduction in dynamic braking should not be perceptible to the driver of the automobile, since the charge state of the traction battery changes slowly, and therefore the amount of regenerative braking changes slowly. Since the regenerative braking changes slowly, the friction brakes gradually take up any deficit between the dynamic braking and the desired braking force. This, in turn, should reduce the chatter which is evident when the control law simply protects the traction battery from overcharge by simply stopping the regeneration when the batteries are at full charge.

FIG. 4 is a simplified flow chart illustrating that portion 400 of the control laws controlling the control processor 50 of FIG. 1 which results in the type of performance represented by FIGS. 3a and 3b. In FIG. 4, the logic starts at a START block 410, and proceeds to a block 412, which represents monitoring the traction battery pack (20 of FIG. 1) parameters such as temperature, voltage, and current, and also noting time. Samples of these parameters may be taken at frequent sampling intervals, such as at each iteration of the logic through the loop of FIG. 4. From logic block 412, the logic flows to a block 414, which represents an estimation of the state of charge of the traction battery, by determining the amount of charge which has entered the battery, and subtracting the amount of charge which has left the battery. The measure of this charge is the amphour. Once an estimate is made of the state of charge of the traction battery, the logic flows to a decision block 416, which compares the current or present-time estimated state of charge of the traction battery with the predetermined value of charge represented by the "first charge" level of FIGS. 3a and 3b; as mentioned above, this charge level is less than full charge. If decision block 416 finds that the estimated charge level of the traction battery is less than the first charge level, the logic leaves decision block 416 by the YES output, and proceeds to a further block 418, which represents allowing full regenerative braking energy or power to be utilized. The action taken in block 418 may be, for example, adjusting the field current in the traction motor (operating in its generator mode) during braking so as to maximize the electrical output of the traction motor. It should be noted that some types of motor/generators have no distinct field winding, but rather have pluralities of windings in which one winding has its desired current induced or inducted by controlled current in another winding; for purposes of the description, the way the field current is generated is irrelevant, it is sufficient that it is generated in the desired amount. From block 418, the logic flows back to block 412 to begin another iteration around the loop. As the hybrid electric vehicle is driven in this state, the traction battery will often become more fully charged due to the continuous injection of energy (by the action of the auxiliary internal-combustion-engine/generator) into the energy storage system which includes the traction battery and the motion of the vehicle.

Eventually, the state of charge of the traction battery will exceed the "first charge" level illustrated in FIGS. 3a and 3b. At that time, the iterations of the logic of controller 50 of FIG. 1 around the portion of its preprogrammed logic represented by logic loop 400 of FIG. 4 will change, since the logic flow will no longer be directed from the YES output of decision block 416, but will instead be directed to the NO output. From the No output of decision block 416, the logic flows to a further block 420, which represents reduction of the magnitude of the regenerative power or energy available in the form of kinetic energy of the vehicle, in inverse relation or proportion to the present-time amount of charge relative to the difference between full charge and the first charge level of FIGS. 3a and 3b. Thus, if the current state of charge is at 70% of the way between the first charge and full charge, as illustrated by $C_c$ in FIGS. 3a and 3b, the amount of the energy of motion which is allowed to be recovered and coupled to the battery is 30%. When the current charge level reaches 100%, the allowable regeneration is 0%. As mentioned above, the control of coupling of energy or power from the traction motor acting as a generator can be accomplished simply by adjusting the command torque of the drive in a field oriented controlled alternating current motor. In an actual embodiment of prior art, the torque is reduced proportionally to speed in order to control the amount of power produced by the motor acting as a generator which is returned to the traction battery.

As so far described, the logic of FIG. 4 controls the regeneration in accordance with the state of charge of the traction battery. This means that the retarding force acting on the vehicle by the traction motor acting as a generator is reduced during braking. One of the advantages of an electric vehicle which uses regenerative braking is that the friction brakes are not required to do all of the braking, and so their design and construction may be such as to take advantage of the lesser usage, as for example by making them lighter in construction. As so far described in conjunction with the logic of FIG. 4, the dynamic braking is reduced under certain charge conditions of the traction battery. In order to provide additional braking during those times when the regenerative braking is reduced, in another version, the logic flows from block 420 of FIG. 4 to a further block 422, which represents reduction of the efficiency of the traction motor acting as a generator. This reduction of the efficiency of the traction motor acting as a generator can be accomplished by adjustment of either the slip or of the current in the field winding, or preferably both. From block 422 of FIG. 4, the logic returns to block 412, to begin another iteration "around the loop" or through the logic 400.

As so far described, the chatter or uneven performance resulted from protection of the fully-charged battery from additional charge. A similar effect occurs upon acceleration with a nearly discharged battery. During acceleration of the vehicle 10 of FIG. 1, both the traction battery 20 and the auxiliary or secondary electrical source 16 (the internal-combustion-engine/generator) are available as sources of electrical energy for the traction motor 40. Consequently, the traction motor 40 can provide power at a rate which is the sum of the maximum power which can be drawn from the traction battery 20 together with the maximum power which the auxiliary source 16 can provide. This is convenient for operation in a city, where bursts of acceleration may require significant power. However, under some conditions, the traction battery protection controls, if they simply stop drawing power from the traction battery when the battery reaches a state of charge which is deemed to be a discharged state, will also cause a form of chatter. This form of chatter occurs if the vehicle is running uphill for a long period of time, such as in crossing the Continental Divide. If the rate of utilization of energy in raising the vehicle along the road exceeds the rate of delivery of energy by the auxiliary source 16, the batteries will continuously discharge, and eventually reach the level of charge deemed to be the "discharged" level. If, at that time, the traction battery controller were to simply cut the traction battery from the traction motor circuit, the amount of current available to the traction motor would suddenly decrease to the level provided by the auxiliary source 16, with a consequent abrupt change in tractive power, and the vehicle would experience a sudden reduction in speed. Removal of the traction battery discharge to the traction motor, however, allows the battery voltage to rise abruptly to its no-load voltage. If the controller interprets this rise in voltage as indicating that the traction battery has usable charge, it may reconnect the traction battery to the traction motor, thereby once again providing additional tractive power from the traction battery, but causing the voltage of the traction battery to drop. Those skilled in the art will recognize this as an oscillatory condition, which may cause the vehicle to "chug" or lurch repeatedly during the climb.

It should be noted at this point that a "fully" discharged battery, in the context of a traction battery in which long life is desired, still contains a substantial charge, because the life of such batteries is dramatically reduced if the depth of discharge is too great; thus a discharge battery for the purposes of discussion of electrically driven vehicles is one in which the batteries are at a state of charge which is deemed to be the full-discharged condition, but which still contains a substantial charge. In a hybrid electric vehicle, the auxiliary energy source provides energy continuously, which can be used to charge the traction batteries if the traction demand is less than the output of the auxiliary energy source. The control laws allow both the auxiliary energy source and the traction batteries to provide energy to the traction motor. When traction motor demand exceeds auxiliary source output, current is drawn from the traction battery, which causes its voltage to drop. If the traction battery is near a full discharge condition, the voltage drop due to this current draw may be such as to trigger battery protection by stopping the current drain from the battery. The removal of the current drain by the control laws, in turn, causes the vehicle to be powered solely by the auxiliary source, and allows the voltage of the traction battery to rise. When the traction battery rises, the control laws no longer recognize the battery as being discharged, and current drain is again allowed from the traction battery. The process of repeatedly coupling and decoupling the traction battery to the traction motor constitutes an oscillation of the control system. This oscillation results in a traction force which varies at the control system oscillation rate, and which may be perceptible to the operator of the vehicle.

In another version as described in the prior art, controller 50 controls the amount of power which can be drawn from the traction battery in response to the state of charge of the traction battery. This avoids the abovedescribed "chugging" situation, and allows a smooth decrease in the speed with which the vehicle can climb a mountain as the battery charge decreases. FIG. 5 illustrates a plot 500 which represents the result of control according to this technique. In FIG. 5, traction power available to the vehicle is plotted against the state or level of charge of the traction battery. Plot 500 includes a portion 510, which represents the continuous output of the auxiliary source of electrical energy or power, which is a relatively low level. Plot portion 510 extends from a level less than the nominal discharge condition to a charge level designated as "low charge point," which is the nominal discharged condition of the traction battery. In an operating region represented by plot portion 512, the tractive power available to the vehicle is at a relatively high level, representing the sum of battery and auxiliary power. This maximum power level represented by plot portion 512 extends from a charge condition denominated as "first charge" to the fully-charged condition. Between the "low charge" condition of the traction battery and the "first charge" condition, the amount of tractive power depends upon the state of charge of the traction battery, as suggested by plot portion 514. The effect of this type of control is to allow operation at full tractive power for a period of time, until the traction battery is partially discharged to the "first" level. As the traction battery drops just below the first level, the amount of battery power which is available to the traction motor is decreased slightly, in an amount which is hoped is not noticeable. This slight decrease in power at a point just below the first charge level of FIG. 5 somewhat reduces the rate of discharge of the traction battery. If the hill is long, the traction battery may discharge further. As the traction battery becomes further discharged in the region between the "low" and "first" charge condition of FIG. 5, relatively less of the battery power is made available to the traction motor, resulting in a further slowing of the vehicle. For the longest hills, the traction battery will ultimately reach the "low" charge condition which is deemed to be nominally discharged. When this level is reached, no more energy is extracted from the traction battery, and, in general, the state of charge of the traction battery cannot extend below the "low" charge level into plot portion 510, unless there is some other drain on the traction battery, such as an emergency override of battery protection under conditions of imminent danger to the vehicle or its occupants. With control as plotted in FIG. 5, there is no abrupt transition in tractive power at any point along the control curve. When the battery charge is just above the "low" charge point, and is making the transition to full operation from the auxiliary electrical source, the amount of tractive power provided by the traction battery is already very small, and the transition should be imperceptible to the vehicle driver.

FIG. 6 is a simplified flow chart which illustrates that portion 600 of the logic of controller 50 of FIG. 1 which provides the control in accordance with plot 500 of FIG. 5. In FIG. 6, the logic begins at a START block 610, and proceeds to a block 612, which represents reading of the battery characteristics, much as in block 412 of FIG. 4. From block 512 of FIG. 5, the logic flows to a block 614, which represents estimation of the state of charge, also as described generally in FIG. 4. Decision block 616 of FIG. 6 determines if the current state of charge is above the "first" charge point of FIG. 5, and routes the logic by way of the YES output of decision block 616 if the charge state is greater than the "first" charge point. From the YES output of decision block 616, the logic flows to a block 618, which represents the making of full traction power available to the traction motor. This is accomplished by removing power limits, as described in conjunction with FIGS. 7a and 7b, in the software controlling the inverter, noting that the auxiliary source is a source only, while the battery and the motor/generator can be sources or sinks, depending on the operation of the inverter. From block 618, the logic flows back to block 612, to begin another iteration through the logic of FIG. 6. In general, when starting out with a near-fully charged traction battery, the logic will iterate around the loop including blocks 612, 614, 616, and 618 of FIG. 6 for so long as the traction battery charge exceeds the charge represented by the "first" charge level in FIG. 5.

On a long climb, the traction battery charge may eventually drop to equal or less than the "first" charge point of FIG. 5, and on the next iteration through the logic of FIG. 6, the logic 6 will exit decision block 616 by the NO output, and will proceed to a block 620. Block 620 represents reduction in the amount of power available to the traction motor from the traction battery in an amount which depends upon the magnitude of the current traction battery charge relative to the difference in charge between the "first" and "low" charge states of FIG. 5. For example, if the present-time level of charge of the traction battery drops below the "first" charge condition of FIG. 5 to a level represented in FIG. 5 as "current charge," which is 9/10 of the way between the charge levels represented by the "low" and "first" charge levels, controller 50 controls the amount of power available to the traction motor from the traction battery to be 90% of the battery-supplied component of the full power represented by plot portion 512. Put another way, since the current state of charge indicated in FIG. 5 as "current charge" is 90% of that component of the full traction power designated as being attributable to the battery, the battery power provided to the traction motor is reduced to 90% of the battery power. Naturally, there is no requirement that plot portion 514 of FIG. 5 be a linear ramp as illustrated, but the control system is simplified if plot portion 514 is at least monotonic. From block 620 of FIG. 6, the logic flows to a decision block 622, which compares the traction motor power demand with the power from the auxiliary source of electrical energy. If the traction power demand exceeds the power from the auxiliary source of electricity, the batteries are being discharged, and the logic leaves decision block 622 by the YES output. From the YES output of decision block 622, the logic flows to a block 624, which represents increasing the power available from the auxiliary source to its maximum value. From block 624, the logic flows to a decision block 626. Decision block 626 compares the current state of charge of the traction battery with the "low" charge point of FIG. 5. If the state of charge is below the "low" charge point, indicating that the traction battery should not be further discharged in order to prevent damage to the traction battery, the logic leaves decision block 626 by the YES output, and proceeds to a logic block 628. Block 628 represents limitation of the traction motor power, by FOC control, to the known amount of power available from the auxiliary source of electrical energy, readily determined as the product of the voltage multiplied by the current. From block 628, the logic flows by way of a logic path 630 back to block 612 by way of a logic path 630, to begin another iteration through the logic of FIG. 6. If, when decision block 626 examines the state of charge of the traction battery, the current state of charge is greater than the "low" charge point of FIG. 5, the logic leaves decision block 626 by the NO output, and proceeds over logic path 630 back to block 612, without transiting block 628. Thus, when there is significant usable charge in the traction battery, the logic of FIG. 6 permits its use. If, during the transit of the logic through FIG. 6, decision block 622 finds that the traction power is not greater than the power produced by auxiliary source 16, the logic leaves decision block 622 by the NO output, and proceeds by way of logic path 630 to block 612, to begin another iteration; this path bypasses the increasing of the power of the auxiliary source 16 to the maximum.

FIG. 7a illustrates a simplified parametric plot 710a, 710b, 710c, . . . , 710N of motor (or generator) power versus speed. In FIG. 7a, plots 710a, 710b, 710c, . . . , 710N have a sloped portion 712 in common. Power for a motor or generator is the product of torque multiplied by speed. Consequently, at zero speed, the power is zero, regardless of the torque. As speed increases at constant torque, the power increases, as suggested by portion 712 of the plots of FIG. 7a, up to a speed $\omega_{base}$. Above frequencies of $\omega_{base}$, the design of the motor/generator is such that no more power can be handled, for thermal or other reasons. Consequently, at maximum torque, the power of the motor/generator is limited by the control laws of the inverter to lie on plot 710a. If the torque is somewhat less than the maximum torque, the maximum power is achieved at a slightly lower motor speed than omega sub base, represented by plot 710b. Plot 710c represents a still lower magnitude of torque, and the lowermost plot, 710N, represents the lowest torque which the quantized control system can sustain. The control system will limit the torque produced by the motor to a limiting value, depending upon the speed, to prevent the motor from operating at above the desired maximum power limits. The limiting torque torque_limit is determined simply by dividing the maximum power by the current motor speed torque_limit=$P_{max}$/speed and the resulting limit on torque causes the power plot to limit at a value no greater than that represented in FIG. 7a by plot 710a and plot portion 712. If the power is to be limited to a lesser value than $P_{max}$, the power plot which the motor follows will correspond to one of plots 710b, 710c, . . ., 710N of FIG. 7a. FIG. 7b is a simplified block diagram illustrating the relationship of the torque command and the power limiter. In FIG. 7b, the torque_command is applied to a limiter block 714, which adjusts the magnitude of the torque command (Limited Torque_Cmd) which arrives at the Field Oriented Control (FOC) inverter 28 in a manner which limits the power to lie under a curve 716. Curve 716 is a plot of torque versus speed determined by dividing the selected or set power P by the motor speed.

Thus, the FOC inverter can control the power of the motor by control of the commanded torque in view of the motor speed. The torque in question may be traction or driving torque, or it may be retarding or braking torque. When control of the power flowing to the batteries from the motor, acting as a generator, is desired, the appropriate FOC commands result in application of the limit.

In FIG. 8, the desired torque or torque command is derived from an electrical accelerator (not illustrated) and applied by way of a path 810 to a first input port of a multiplier 812, which receives sensed vehicle speed (or traction motor speed if the vehicle is equipped with changeable gears) from sensors (not illustrated) at its second input port 814. Multiplier 812 takes the product of motor speed and commanded torque, to produce a signal representing commanded power to be applied to the traction motor. A block 816 scales the commanded power by a constant k, if necessary, to convert the signal to a representation $P_C$ of commanded traction motor power in watts. The signal $P_C$ representing the commanded power in watts is applied from block 816 to a further block 818, which represents the division of the commanded power in watts by the traction battery voltage, to get a signal representing the commanded traction motor current ($I_C$=P/E). The traction battery voltage is an acceptable indicator of the traction motor voltage, because all the voltages in the system tend toward the battery voltage. The signal representing the commanded current $I_C$ is carried by a signal path 819 to a portion of the command controller 50 of FIG. 1 for control of the FOC inverter 28 and the traction motor 40 in a manner which produces the desired motor current. the signal representing the commanded current $I_C$ is also applied from the output of block 818 by way of a scaling circuit illustrated as a block 820 to an error signal generator 822. The purpose of the scaling circuit 820 is explained below, but its action results in conversion of the commanded motor current $I_C$ into commanded generator current $I_G$. Error signal generator 822 generates an error signal by subtracting a feedback signal from a signal path 824, representing the sensed output current of the internal-combustion-engine/generator (generator), from the commanded generator current $I_G$. The error signal produced by error signal generator 822 is applied to a loop compensating filter, which may be a simple integrator, to produce a signal representative of the commanded speed of the auxiliary source 16 of electrical energy, more specifically the diesel engine 18. The diesel engine 18 drives the electrical generator 22, to produce alternating output voltage for application by way of power conductors 832 to inverter 28 of FIG. 1. A current sensor arrangement illustrated as a circle 834 is coupled to the output conductors 832 for sensing the generator current. Blocks 822, 826, 18, 22, and 824 of FIG. 8 together constitute a closed feedback loop which tends to make the output current of generator 22 equal to the magnitude commanded by the control signal $I_G$ applied to the error generator. Loop compensator 826 is selected to prevent the speed of the diesel engine from changing too rapidly, which might undesirably result in an increase in emission of pollutants, As so far described, the arrangement of FIG. 8 produces a signal $I_C$ for commanding the traction motor current for control of the motion of the vehicle, and also produces a signal $I_G$ which commands the current of the auxiliary generator 22. In FIG. 8, a signal representing a desired state of charge (SOC) of the traction battery is received at the noninverting input port of a summing circuit 850. A signal representing the current state of charge is received at the inverting input port of summing circuit 850 from a battery state-of-charge (SOC) determining block 852. SOC block 852 receives signals representative of battery voltage, battery temperature, and battery currents. In general, the state of charge of a battery is simply the time integral of the net of the input and output currents. SOC block 852 integrates the net amperes of current to produce ampere-hours of charge, modified by battery temperature and discharge rate. As one specific example, a room-temperature battery which gives 120 amp-hours at a discharge rate of 1 ampere, but only 30 ampere-hours at 300 amperes discharge; these values will be somewhat higher at battery temperature of 100° F., and about half the stated values when near freezing. Summing circuit 850 produces, on a signal path 854, an error signal which represents the difference between the desired or commanded state of charge of the traction battery and its actual state of charge, to thereby identify an instantaneous surfeit or deficiency of charge. The error signal is applied to a loop compensating filter 856, which integrates the error signal, to produce an integrated error signal. The integrated error signal changes slowly as a function of time. The integrated error signal acts on block 820 by way of a limiter 858. More particularly, the integrated error signal, when applied to scaling block 820, selects the scaling factor by which the commanded motor current $I_C$ is scaled to make it into the commanded generator current. Limiter 858 merely limits the integrated error signal from block 856 so that the range of scaling factors of scaling block 820 is limited to the range between zero and one (unity). Thus, the commanded generator current $I_G$ can never be greater than the commanded traction motor current $I_C$, but can be less according to the scaling factor commanded by the limited integrated signal from limiter 858, and the commanded generator current $I_G$ can be as low as zero current.

The desired state of charge of the traction battery is a charge level which is less than full charge, so that regenerative braking can be applied without danger of damaging the traction battery due to overcharging. Thus, the set-point of the desired SOC is a charge less than full charge. The operation of the arrangement of FIG. 8 can be understood by assuming that the normal state of the output of the integrator in loop compensating filter 856 is 0.5 "volts," halfway between the 1.0 volt maximum and the 0.0 volt minimum permitted by limiter 858. The value of the integrated error signal (as limited by limiter 858) may be viewed as a multiplying factor by which scaling circuit 820 scales the commanded traction motor current, so that an integrated error signal having a value of 1.0 causes the commanded traction motor current $I_C$ to be transmitted at full amplitude by error signal generator 822, while a value of 0.5 would result in the magnitude of the commanded generator current $I_G$ to be exactly half of the magnitude of the commanded traction motor current $I_C$. In operation of the vehicle under the control of the arrangement of FIG. 8, as the traction battery exceeds the desired state of charge, error signal generator 850 subtracts a large signal value representing a high state of charge from the set-point value, thereby producing a difference or error signal having a negative polarity. The integrator in loop compensating filter 856 integrates. the negative-polarity signal, which tends to "reduce" or drive negative the net integrated signal at the output of loop compensating filter 856 away from its "normal" value of 0.5 volts, possibly down toward 0.3 volts, as an example. Since a value of 0.3 volts of the integrated error signal lies within the permitted range of limiter 858, the integrated error signal simply flows through limiter 858, to control scaling circuit 820 in a manner which causes the commanded traction motor current $I_C$ to be multiplied by 0.3, rather than the "normal" 0.5, to produce the commanded generator current $I_G$. Thus, a state of battery charge greater than the desired set-point results in reduction of the average output of the generator. In the same manner, if the charge state of the traction battery is lower than the desired set-point, the signal applied from block 852 of FIG. 8 to the inverting input port of error signal generator 850 becomes smaller in magnitude than the signal representing the desired SOC, which results in a positive value of error signal at the output of error signal generator 850. The integrator associated with loop filter 856 integrates its positive input signal to produce an integrated output signal which tends to increase above its "normal" value of 0.5 volts, to a value of, for example, 0.8 volts. Since this value is within the values acceptable to limiter 858, the 0.8 volt integrated error signal is applied to scaling circuit 820 without change. The 0.8 volt integrated error voltage causes scaling circuit 820 to multiply the signal representing the commanded traction motor current $I_C$ by 0.8, so that the commanded generator current $I_G$ is greater than previously. The net effect of the decrease in traction battery charge to a value below the set-point is to increase the average output power from generator 22, which should tend to increase the traction battery charge level. Those skilled in the art will understand that the "normal" value of integrated error signal referred to above does not actually exist, and is used only to aid in understanding the operation of the control system.

While hybrid electric vehicles are economically and environmentally advantageous, their design should be such as to reduce their cost, weight, or use of expensive materials.

SUMMARY OF THE INVENTION

A vehicle according to the invention includes, in its most general form, an electric traction drive machine or motor, and a source of electrical energy. It also includes an electrical device which receives fluctuating amounts of electrical energy from one of the traction drive machine and the source of electrical energy. The electrical device is heated by the electrical energy, and if not cooled may be damaged. A cooling system is thermally coupled to the electrical device, for cooling the electrical device by transfer of heat to the environment (ambient). The cooling system is dimensioned for transferring an average amount of the heat arising from the electrical energy, but not the peaks of the fluctuating amount. In other words, if the heat resulting from the peak amount of electrical energy were to be generated continuously, the cooling system would not be able to maintain the temperature of the electrical device below a temperature at which it may be damaged or for which it is rated. A phase-change heat storage material is thermally coupled to the electrical device and to the cooling system, for absorbing excess heat from the electrical device during the peaks, and for transferring stored heat to the cooling system at times other than the times of the peak. Naturally, the phase-change heat storage material may transfer some heat to the cooling system during the time of the peak, too. The phase-change material may be a wax made especially for such applications.

In a particular embodiment of the abovedescribed system, the electrical device comprises a switch controlled for coupling energy to the electric traction drive machine from the source of electrical energy. Ordinarily, the switch will be a semiconductor switch. In another particular embodiment, the electrical device is a resistor, coupled for converting vehicle braking energy into heat.

In the embodiment in which the electrical device is a controlled switch, the controlled switch is part of an electrical switching arrangement coupled to the traction drive machine and to the source of electrical energy, for coupling energy between the source of electrical energy and the motor under the control of control signals, and operator-controlled control means are included, which are coupled to the switching arrangement, for controlling the amount of energy coupled between the source and the machine by synthesizing a current waveform. The amount of energy being coupled may vary with time, and the power-loss-generated heat in the switching arrangement also varies with time. The phase change energy transducing or storage means, which is thermally coupled to the switching means and to the cooling means, absorbs heat from the switching means when the instantaneous temperature of the switching means tends to rise, and releases heat to the cooling means when the instantaneous temperature of the switching means tends to fall, thereby tending to maintain constant the temperature of the switching means.

In another view, the vehicle includes a drive wheel, and a generator coupled to the wheel for generating electrical energy in response to braking or deceleration. An electrical resistor is coupled to the generator, for converting the electrical energy of braking into heat. A phase change transducer thermally coupled to the resistor, for storing heat from the resistor. In this view, the vehicle further includes a cooling system for cooling the resistor. The cooling system is dimensioned to accommodate an average heat generated by the resistor, as a result of which, or whereby, the phase change transducer stores heat during those times in which the heat generated by the resistor exceeds the steady-state cooling capacity of the cooling system.

DESCRIPTION OF THE INVENTION

Figure 9:
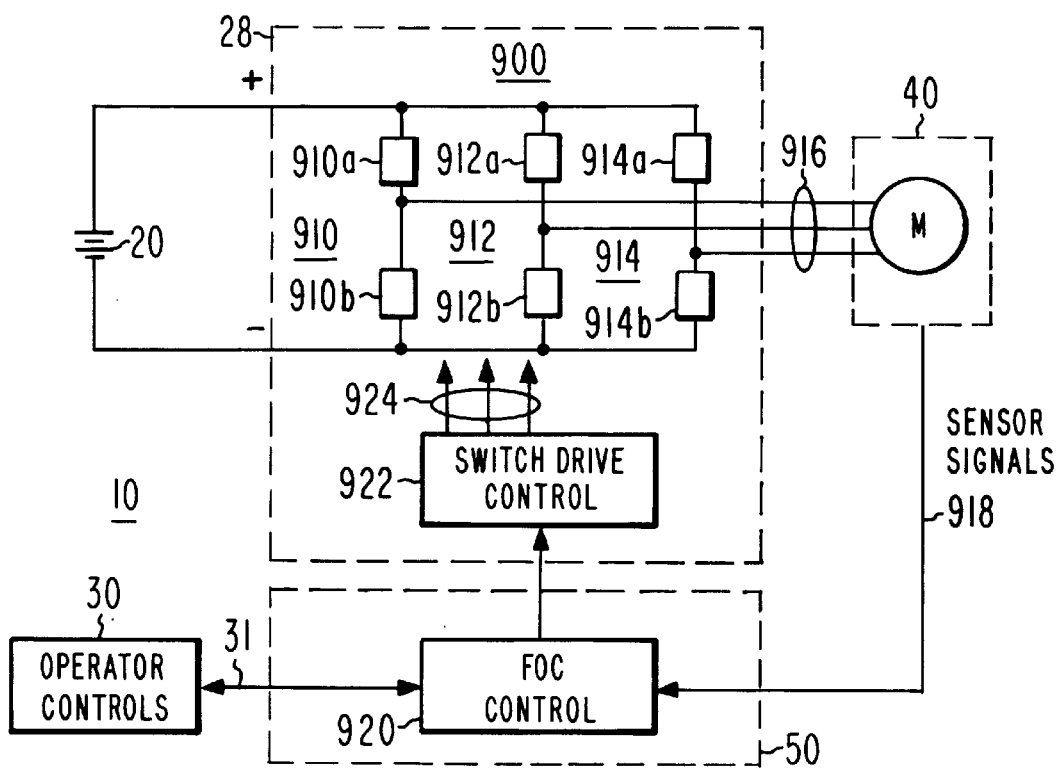
FIG. 9 is a representation of one possible FOC-controlled electrical machine drive, illustrating a possible arrangement of power semiconductor switch connections within the DC-to-AC inverter.

In FIG. 9, DC-to-AC inverter 28 is arranged with a set 900 of switches arranged as three sets of switch pairs serially connected between the terminals of battery 20. More particularly, a first serial connection 910 of semiconductor power switches 910a and 910b is connected between the positive (+) and negative (−) terminals of battery 20, a second serial connection 912 of semiconductor power switches 912a and 912b is also connected between the positive (+) and negative (−) terminals of battery 20, and a third serial connection 914 of semiconductor power switches 914a and 914b is similarly connected. Each serial connection 910, 912, and 914 defines a tap connection 910t, 912t, and 914t, respectively, which provide three-phase power to machine or motor 40 by way of a multiphase path 916. As known in the FOC motor arts, sensors associated with the motor sense at least current in some of the phases and motor speed or position, and the sensed signals are coupled by way of a path designated 918 to an FOC controller 920 associated with command control unit 50. Under control of operator inputs and the sensed motor parameters, FOC controller 920 produces switch control signals appropriate to the situation, and applies them to a switch drive controller illustrated as a block 922. Block 922 includes an interface which converts the switch control signals into signals capable of driving the power switch set 900 of DC-to-AC inverter 28. The actual switch drive signals are applied to the switches 910a, 910b, 912a, 912b, 914a, and 914b by way of paths designated 924. In response, the switches of set 900 produce synthesized alternating waveforms for application to the motor.

As known to those skilled in the art, semiconductor switches produce unwanted heat in response to the switching of electrical power, and the amount of heat which is produced by each switch depends upon at least the instantaneous current and the rapidity with which the switch makes the transition between the ON and OFF states. As often happens in engineering, there tends to be a tradeoff between (a) the large semiconductor dimensions required to handle substantial current and (b) the switching speed, so that switches capable of handling large currents tend to be slower in switching between ON and OFF states. Consequently, power losses or heat generation in high-power switches tend to be larger than desired, and are more or less monotonically or directly related to the power consumption of the motor, which in turn depends upon the load. Thus, when rapid or hard acceleration of a vehicle is commanded, the FOC controller 920 of FIG. 9 causes the switches of set 900 of switches to apply relatively large synthesized signals to the motor, which responds with a large torque. The large torque provides the desired hard acceleration of the vehicle. After a period of acceleration, the vehicle will reach a suitable speed, and no acceleration is then needed. Instead, only a relatively low power is required to maintain constant speed. Those skilled in the art know that a modern automobile requires only ten to twenty horsepower to maintain constant speed on a level highway.

Figure 1:
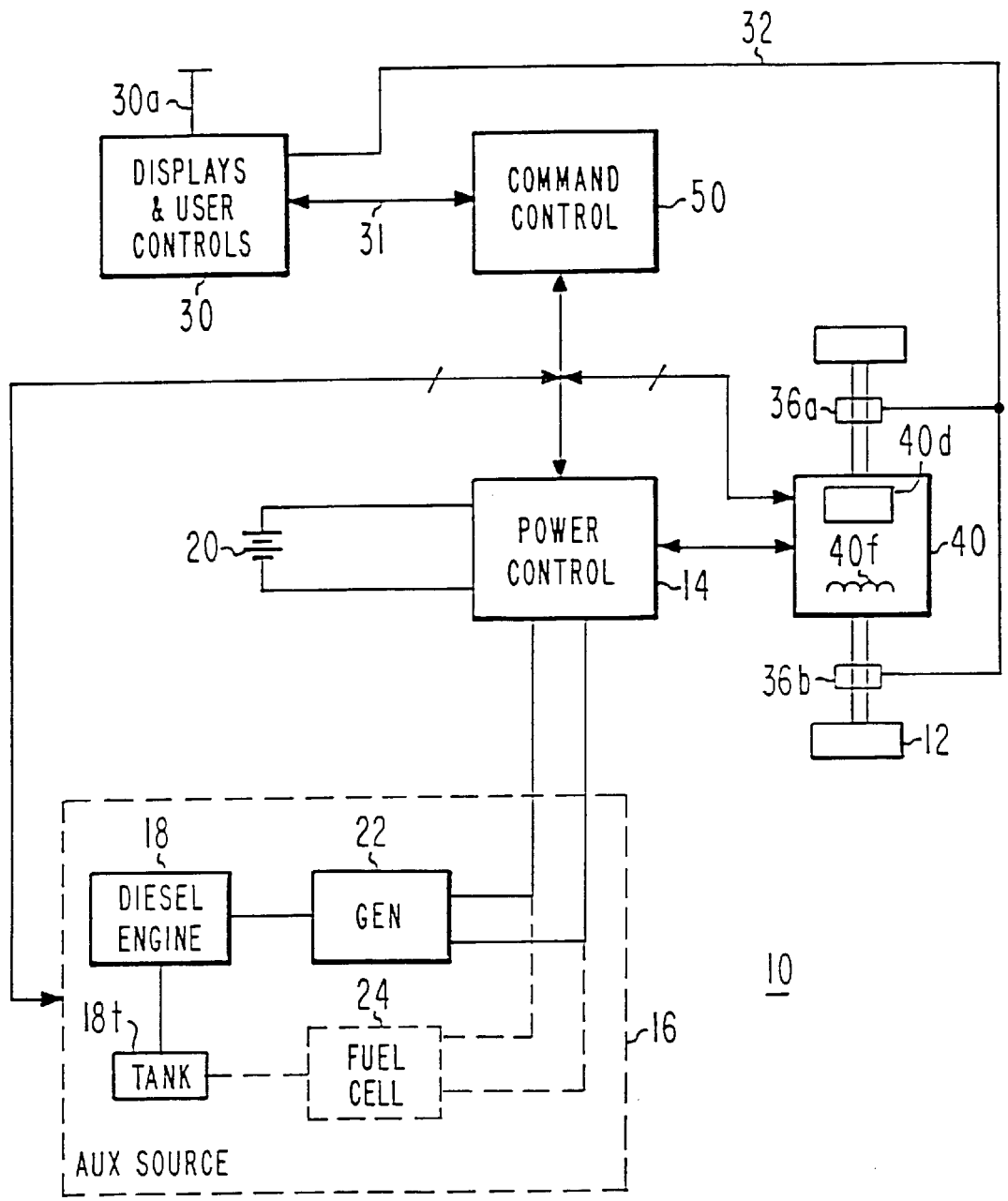
FIG. 1 is a simplified block diagram of an electric vehicle, including a command controller according to the prior art, which performs control functions, and also including a power controller.
Figure 2:
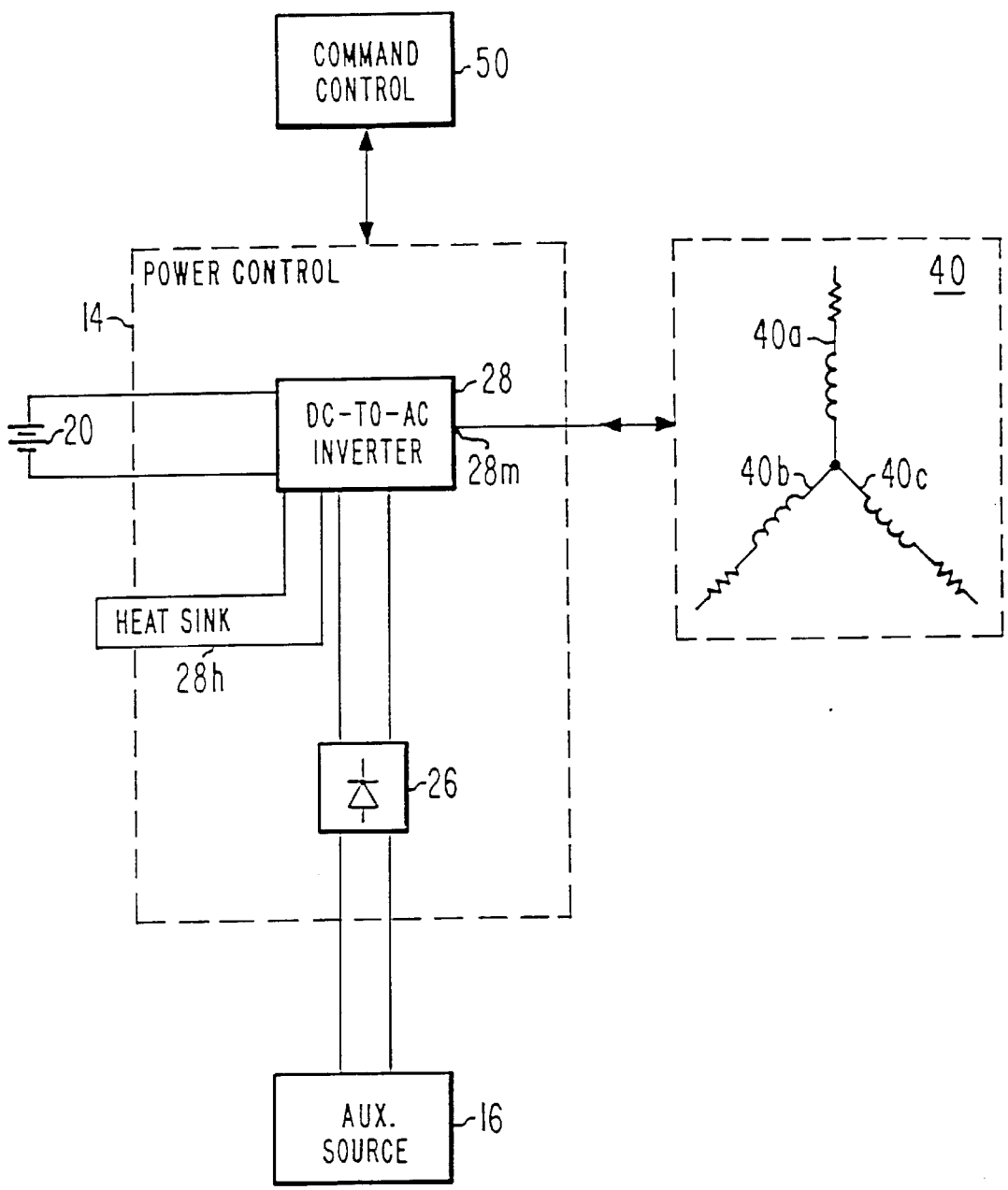
FIG. 2 is a simplified block diagram illustrating some of the functions performed within the power controller of FIG. 1.
Figure 3A:
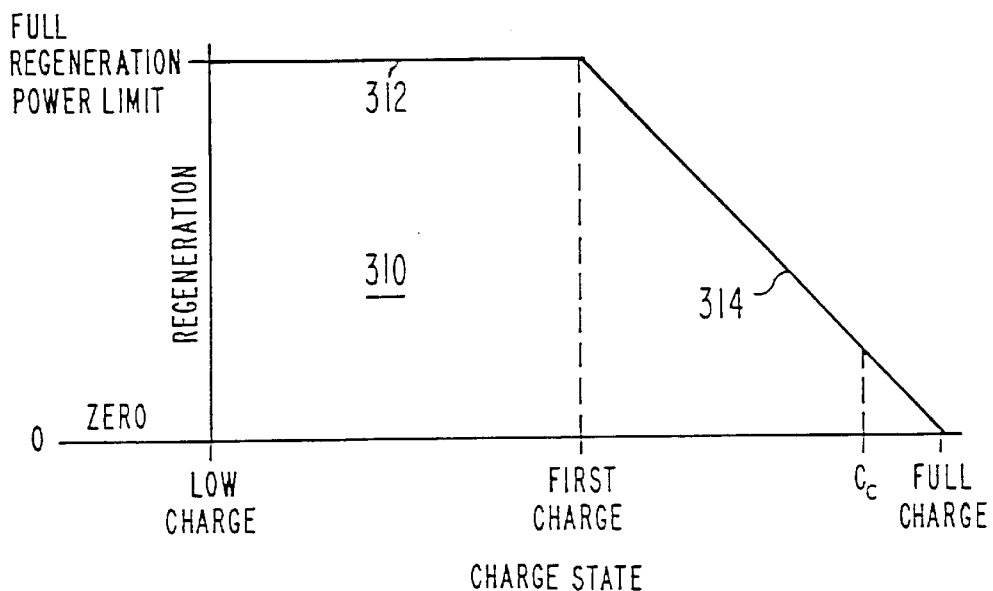
FIGS. 3a and 3b are simplified plots of energy regeneration to the traction battery versus traction battery charge state and traction due to regeneration versus traction battery charge state, respectively, all in accordance with the prior art.
Figure 3B:
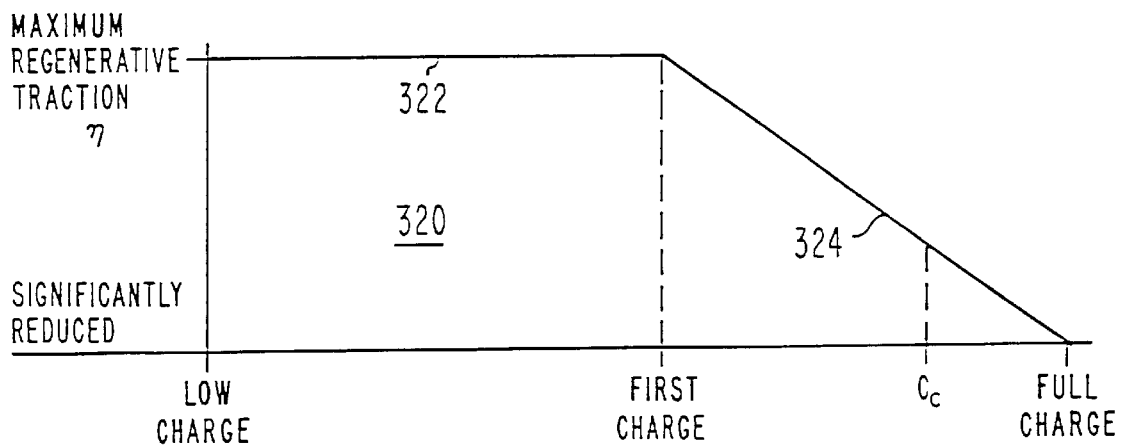
Figure 4:
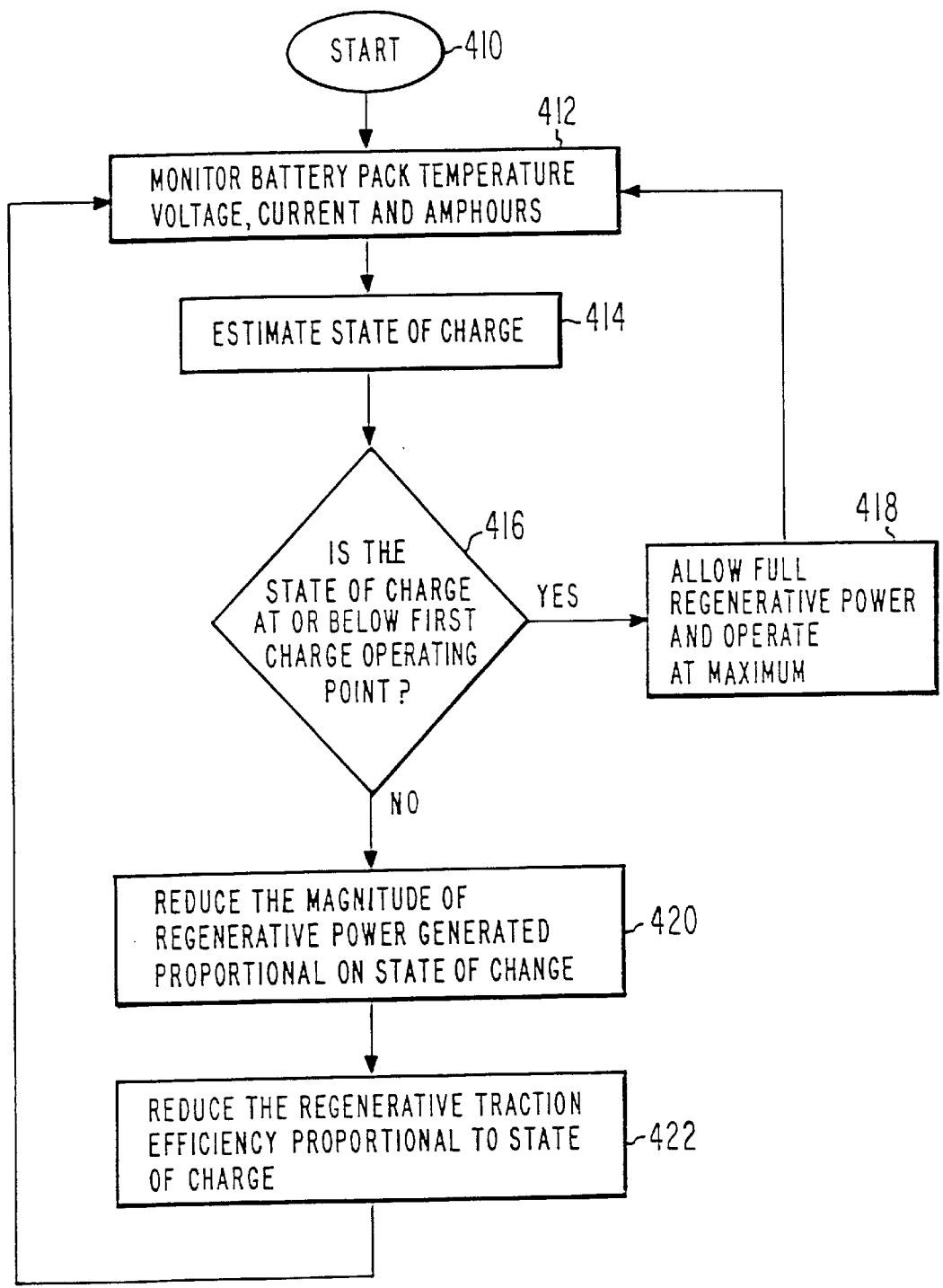
FIG. 4 is a simplified flow chart illustrating the logic flow in the command controller of FIGS. 1 and 2 to provide the operations illustrated in FIGS. 3a and 3b.
Figure 5:
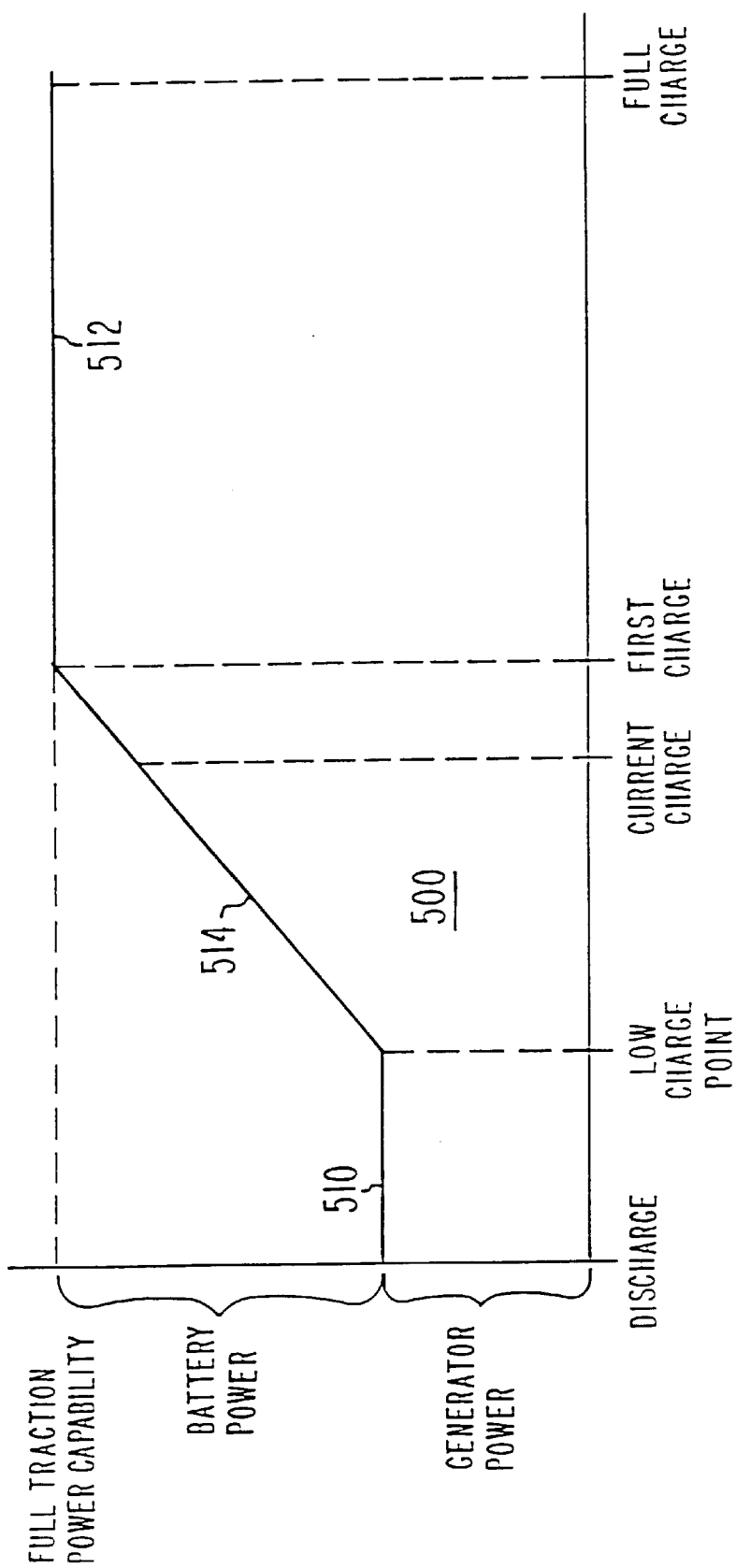
FIG. 5 illustrates a simplified plot of the distribution of the supply of traction power to the traction motor of the vehicle of FIG. 1 as a function of traction battery charge, as described in the prior art.
Figure 6:
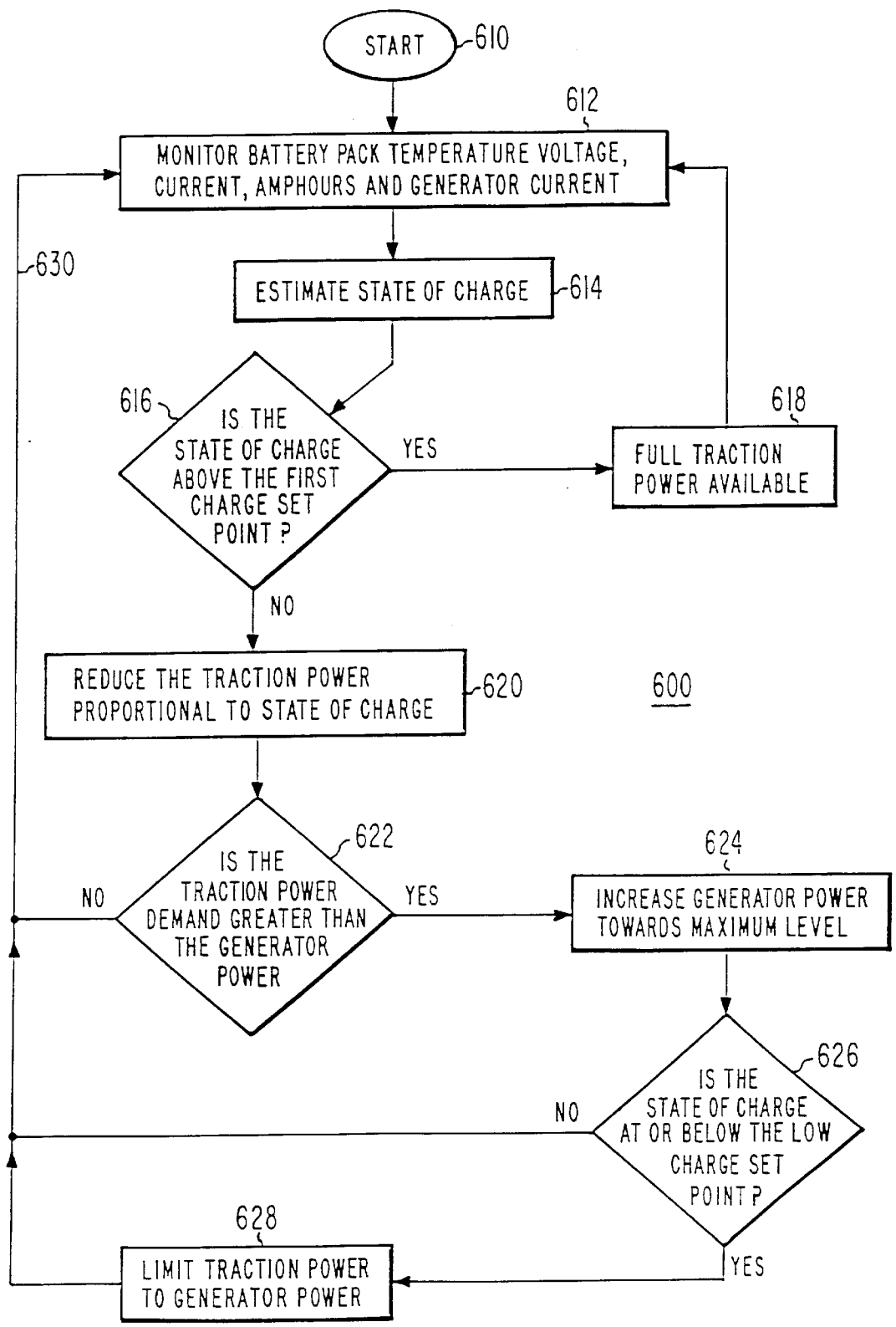
FIG. 6 is a simplified flow chart illustrating the logic flow in the command controller of FIGS. 1 and 2 to provide the operations illustrated in FIG. 5.
Figure 7A:
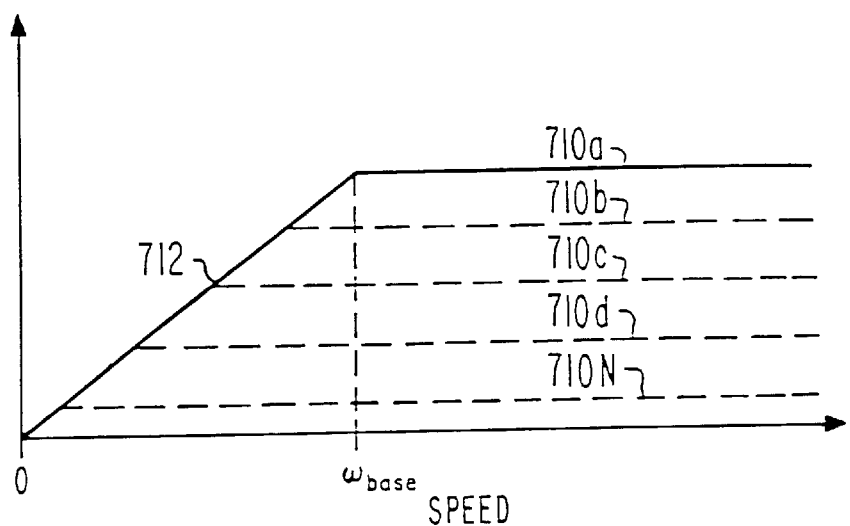
FIG. 7a is a plot of motor or generator power versus speed with torque as a parameter.
Figure 7B:
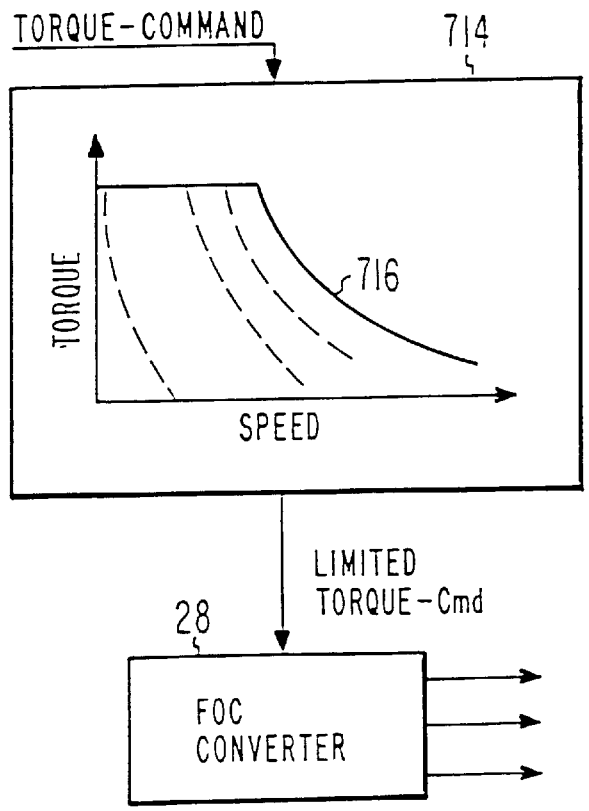
FIG. 7b is a representation of how the power of the motor/generator is controlled in a prior-art arrangement.
Figure 8:
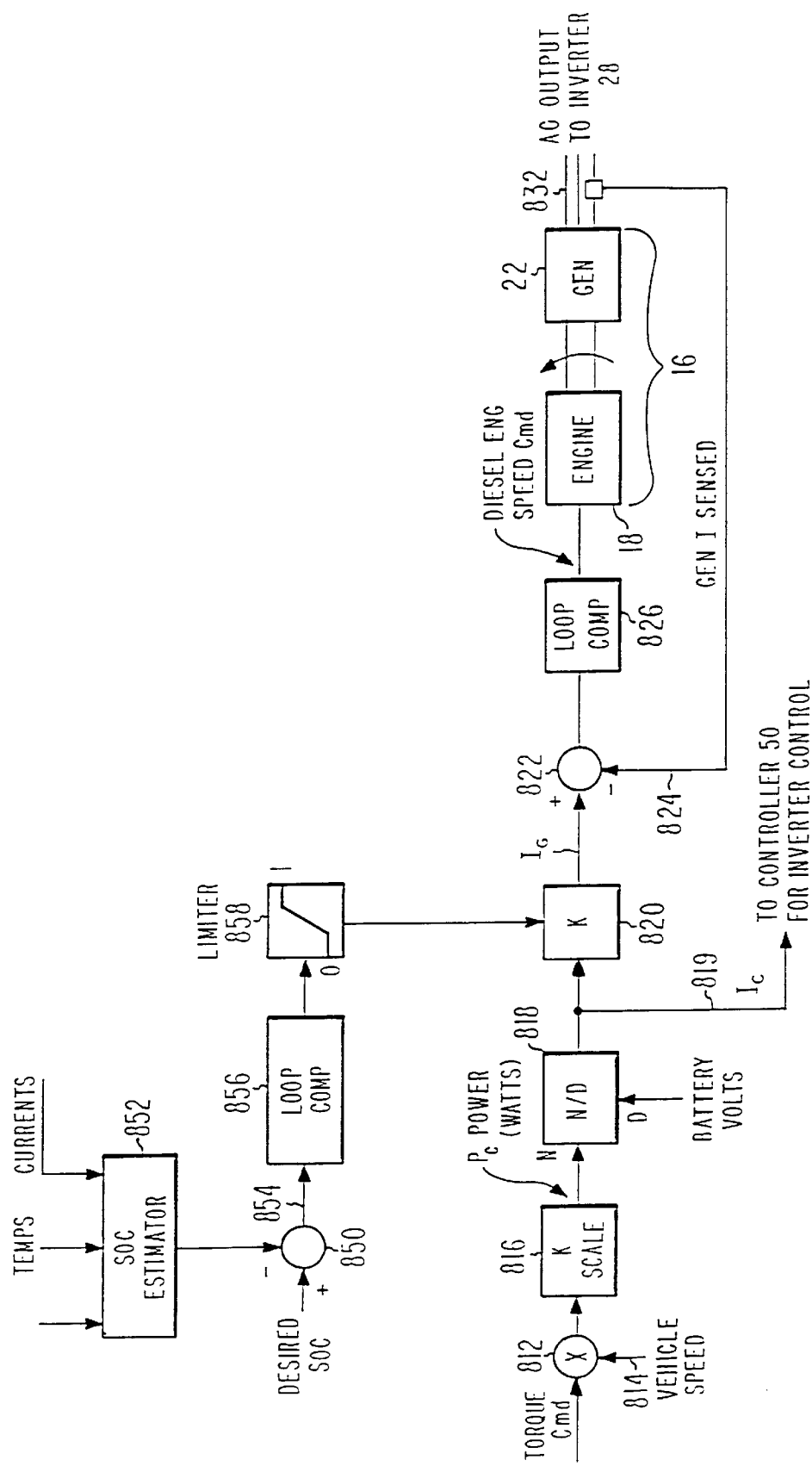
FIG. 8 is a simplified block diagram illustrating certain prior-art control circuits or arrangements for controlling the amount of electric power generated by the auxiliary power source in response to the state of charge of the traction battery.
Figure 10:
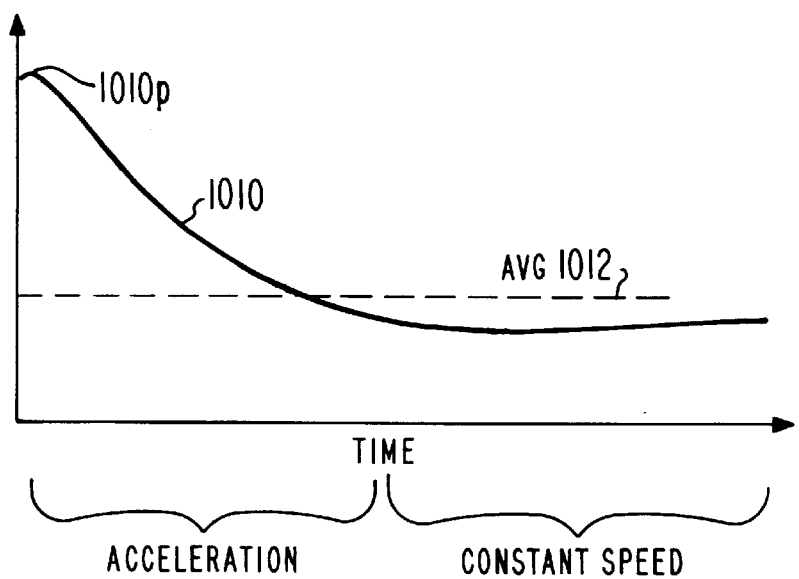
FIG. 10 plots power handled by the semiconductor switches of the arrangement of FIG. 9 versus time during the operation of an electric vehicle, showing that the peak power or energy far exceeds the average power or energy.

FIG. 10 illustrates a conceptual plot 1010 of instantaneous power required by motor 40 of FIGS. 1 or 9 as a function of time, during the course of a single acceleration from a stopped condition to a constant speed. The portions representing acceleration and constant speed are indicated. Since the power supplied to the motor must be handled by the switches of set 900 of FIG. 9, plot 1010 also represents the instantaneous power "dissipation" or heating in the set 900 of switches. It can be seen from plot 1010 that the heating of the switches is much greater during acceleration than during constant-speed operation. As known, semiconductor devices must be maintained below certain temperatures. For example, silicon-based devices are subject to rapid degradation at temperatures of 200° C. As the peak operating temperature is reduced, the reliability or operating lifetime of the device tends to increase in an exponential manner. For silicon devices, almost indefinite life can be expected if the device temperature remains below 130° C. Thus, it is important to provide sufficient cooling to avoid instantaneous temperature increases of the semiconductor switches. For this purpose, many prior-art semiconductor arrangements provide a finned heat "sink." Such heat sinks are not really sinks, but are merely conduits which facilitate the transfer of heat to the surrounding medium. Most often, the surrounding medium is air at the ambient temperature. The cooling of semiconductor devices in this manner is very similar to the cooling of air-cooled engines, such as those of motorcycles, lawn-mowers, and the original Volkswagens, by passage of an air stream over a finned or other exposed surface.

When cooling of a semiconductor device is provided by a stream of air (or water, oil, or the like), the amount of cooling must be such that the temperature of the device does not exceed a predetermined limit value, and thus the cooling system must be capable of carrying away the heat dissipation so that under worst-case conditions, the limit temperature is not exceeded. In the presence of a varying load, application of this principle requires that the cooling system be capable of carrying off enough heat so that, at peak power, the limit temperature is not exceeded. According to an aspect of the invention, the semiconductor device, namely the power switch set 900 of FIG. 9 in the context of the electric vehicle, is thermally coupled to a phase-change heat converter or "sink." Phase-change materials change state, as for example from a solid to a liquid, and back, in response to the application and withdrawal of heat, at essentially a constant temperature. An well-known example of phase change this change of phase at constant temperature is the melting (transition from the solid to the liquid state) or fusion (transition from liquid to solid) of ice at 32° F. Thus, a phase-change material tends to absorb or give up heat to tend to maintain a constant temperature.

Figure 11A:
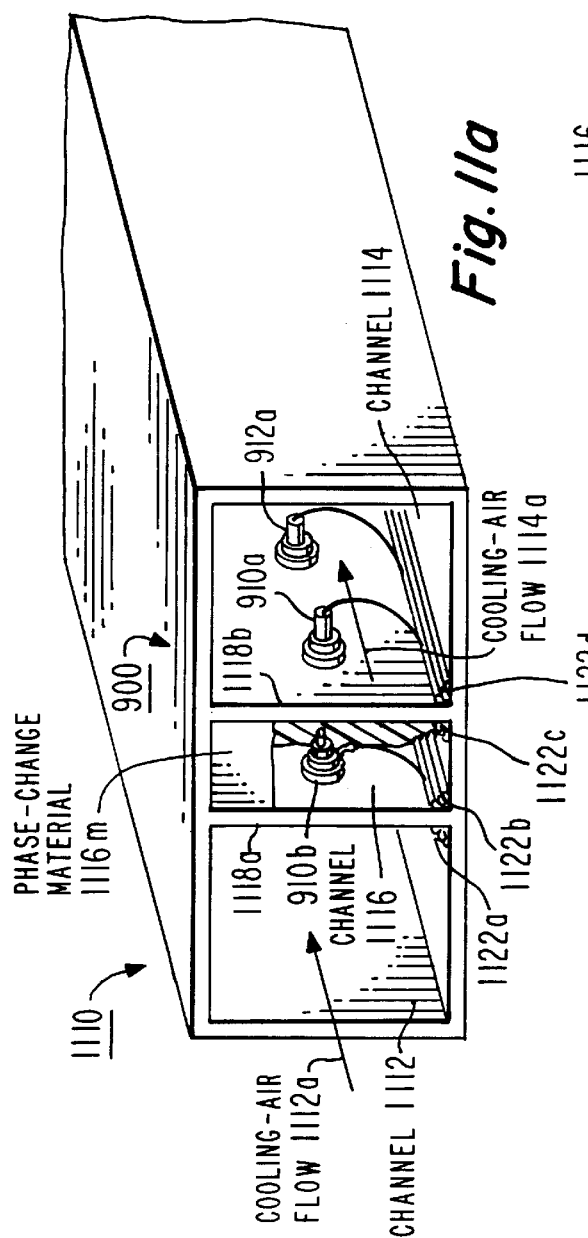
FIGS. 11a, 11b and 11c are is a representation of a physical arrangement for a power switch mounting which provides continuous heat transfer to an external sink, together with phase-change heat accumulation for absorbing transient peaks in the heat produced by the switches.
Figure 11B:
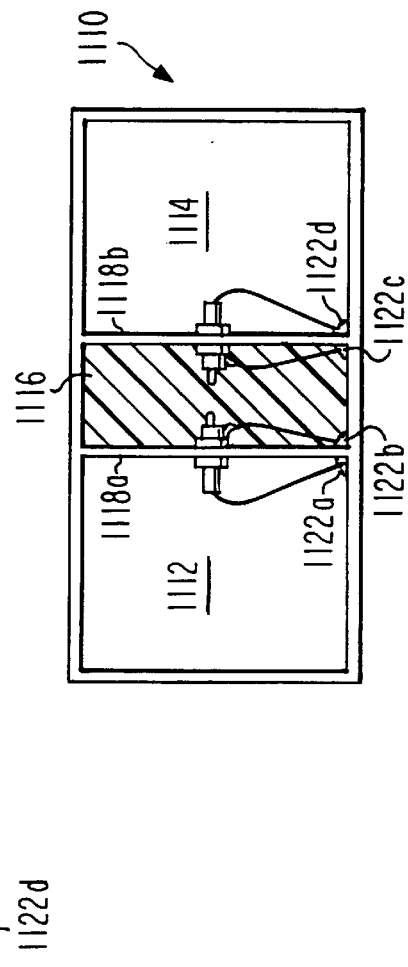

FIG. 11a is a simplified perspective or isometric view, and FIG. 11b is an end view, of a portion of the DC-to-AC inverter 28, showing a three-channel structure 1110 defining a left air-flow channel 1112, a right air-flow channel 1114, and a central channel 1116. As illustrated, the channels are separated from each other by a pair of septums (jointly septa) 1118a and 1118b, which are preferably of a thermally conductive material, such as metal. Septums 1118a and 1118b physically support the set 900 of switches, only some of which are visible in FIGS. 11a and 11b. Each switch of the set 900 of switches is electrically connected to the motor 40 (not illustrated in FIGS. 11a, 11b, or 11c) and the drive circuits 922 (not illustrated in FIGS. 11a, 11b, or 11c) by way of wires, bundles of which are designated 1122a, 1122b, 1122c, and 1122d. The packaging of the electronic switches may be of any type, but for definiteness, stud-type packages are illustrated.

Figure 11C:
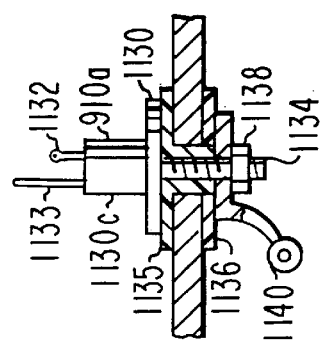

In FIG. 11c, switch 910a is illustrated as being associated with a stud-mounted package including a broad heat-spreading base 1130, a cover 1130c. A power electrical connection 1132 and a control signal connection 1133 extend through the cover 1130c. The second power electrical connection is made by way of a connection washer 1140 to a stud 1134 affixed to the base 1130. As known to those skilled in the art, the switch 910a may be electrically isolated from its mounting septum 1118b, while maintaining thermal conductivity, by using a pair of dielectric washers including a formed washer which extends through the switch mounting hole (not separately designated), together with a simple dielectric washer 1136. The switch is held in place by a nut 1138 which bears on connection washer 1140, and which when tightened compresses the dielectric washers. Such mountings are well known in the art.

As mentioned, phase change material is used to aid in maintaining the temperature of the switches of set 900 below a desired temperature, notwithstanding changes in heat generation within the switches. In FIGS. 11a and 11b, the third channel 1116 is filled with phase-change material designated 1116m. In one embodiment of the invention, the material is a wax or paraffin material, of the "plastic" microcrystalline type, such as is manufactured, for example, as "Victory" by Calwax corporation of 155 North Aspan Avenue, Azusa, Calif. 91702. victory wax has a heat of fusion of 80 BTU/lb. and melts at 174° F. The phase-change material is placed within the channel by the simple expedient of closing off one end of channel 1116, melting the phase-change material, and pouring the melted material into the channel. The channel is then closed off, to prevent the material from leaking out when in the liquid state.

In operation at low load, the air flow (indicated by arrows 1112a and 1114a) through the side air-flow channels 1112 and 1114 is constant, and sufficient to maintain the switches and the phase-change material well below their respective limit and critical temperatures. As the power handled by the switches increases during a surge of power, the temperature of the switches tends to rise, and heat is coupled to the septa 1118a and 1118b. As the temperature of the switches and septa rises, the air flow carries off more and more heat, since more heat is transferred to the air as the temperature rises (that is, the air at the outlet is warmer). At the critical temperature of the phase-change material, it begins to change to a liquid state. As the phase-change material changes state, its temperature remains approximately constant, and therefore the septa, and the switches mounted thereon, tend to remain at or near the critical temperature of the phase-change material. The critical temperature of the phase-change material is selected to be well below the design limit temperature of the semiconductor switches. The air cooling system continues to remove heat, and this heat removal is at the greatest rate that can occur so long as the phase-change material is not completely liquified. So long as the phase-change material includes some material in the solid state, the temperature of the switches cannot increase beyond the critical temperature of the phase-change material. It should be noted at this point that there is always a thermal impedance between the semiconductor chip mounted within the package and the solid portion of the phase-change material, so when reference is made to "the same" temperature, allowance must be made for the effects of the thermal impedance. When the power surge passes, the power handled by the switches returns to a value slightly above the normal value (since the peak value and the low-power value must lie on opposite sides of the "average" value, as represented by line 1012 in FIG. 10). When the power level handled by the switches is below the average power level, the cooling system carries off more heat than is generated by the switches, and the temperature of the septum tends to decrease (although it cannot actually drop until the phase-change material completes its return to the solid state). The heat carried away by the air cooling system continues to carry away heat at its maximum capacity (so long as the phase-change material is not liquid), and eventually the phase-change material is completely solidified. At this point, the temperature of the septa can actually drop as the heat carried away by the air cooling system exceeds the heat generated by the switches. The cycle of power surge, some temperature rise, melting of the phase-change material, reduction of the surge, carrying away of heat, and solidification of the phase-change material can be carried out as many times as desired.

A salient advantage of the use of phase-change material to supplement a conventional fluid-flow cooling system is that the cooling system does not have to be capable of handling the full power of the power surge. So long as the cooling system is capable of transferring away the average heat generated by the switches, and the phase-change material has enough heat-absorbing capacity to accommodate the duration of the power surge (does not completely melt during the surge), the temperature of the switches can be maintained below the design or selected value. This smaller air-cooling system should be lighter in weight and less costly than one which fully accommodates the surge without the aid of phase-change material.

It will be appreciated that the invention may be used in other contexts in which the load on the electrical machine is variable, as for example in air conditioning systems, where tighter temperature control can be achieved by varying the power applied to a motor-driven compressor, rather than relying on ON-OFF control as used in the past. The variable drive power requires switches having the same general characteristics as those described above, and subject to the same surge temperature rises. Phase-change materials may be thermally coupled to such switches for the same purpose described above.

Other embodiment of the invention will be apparent to those skilled in the art. For example, the electric vehicle may include the improvements or inventions described in copending patent applications Ser. No. 60/148,308, filed Aug. 11, 1999 in the name of Tilyou et al.; Ser. No. 09/080,148, filed May 18, 1998 in the name of Gataric; Ser. No. 09/177,011, filed Oct. 22, 1998 in the name of Chady et al.; Ser. No. 09/369,085, and Ser. No. 09/369,086, filed Aug. 5, 1999 in the name of Grewe. While discretely packaged semiconductor switches are described, more than one, or all of the semiconductor switch devices may be mounted within one package; so many packages as there may be are treated in a manner similar to that described for the individually-packaged switches. While the invention has been described in the context of a hybrid electric vehicle, it is applicable to a non-hybrid electric vehicle, or to a vehicle in which an internal combustion engine is used in parallel with an electric motor.

Thus, in general, an aspect of the invention lies in an electric vehicle in which the traction motor is driven from a battery by way of a controllable electric power switching arrangement. In normal operation of the switches of the switching arrangement, the power losses or heating of the switches depends upon the power being handled; during hard acceleration the power is high, and at constant speed on level ground the power is relatively small. Thus, the power "dissipated" by the switches varies with time. A cooling system transfers heat from the switching arrangement to ambient. During acceleration, the cooling system may not be able to limit the instantaneous temperature of the switches to the desired value. A phase-change heat "sink" coupled to the switches absorbs heat from the switches during hard acceleration, and returns the heat to the cooling system under more constant-speed conditions. The phase-change material may be a phase-change wax. In general, any electronic device which experiences transient power surges may use the same principle, thereby allowing the overall cooling system to be sized for average power, with the phase-change sink acting as an "integrator" to average the power by storing heat when the temperature tends to rise, and returning the heat when the temperature tends to fall. According to another general aspect of the invention, braking is accomplished in an electric vehicle by returning energy to the battery, but when the battery is fully charged and can accept no more charge, braking may be accomplished by coupling the electric power to a cooled phase-change sink. The phase-change material for such use may be iron, or some other substance with a large heat of fusion.

More particularly, an apparatus according to an aspect of the invention includes an electrical machine, which in a preferred embodiment of the invention is a drive motor, such as for an electric vehicle, air conditioner, or the like. The apparatus includes a source of electrical energy, and a controllable switching arrangement coupled to the machine or motor, and to the source of electrical energy, for providing energy to the machine or motor from the source in an amount which varies with time or under the influence of a load. In the context of an electric vehicle, the source of energy is a traction battery, and the machine or drive motor may also return energy to the battery. In a vehicle, and in other applications, such as in the case of an air-conditioner, the energy handled by the switching arrangement varies with time under operator or automatic control, and the power-loss-generated heat in the switching arrangement therefore also varies with time. The power-loss-related heat tends to vary the instantaneous temperature of the switching arrangement. The instantaneous temperature of semiconductor switches, such as those which may be used in the switching arrangement, must not exceed a given value, in order to provide reliable operation. A cooling arrangement is coupled to the switching arrangement, for transferring the heat from the switching arrangement to ambient. However, the instantaneous temperature of the switching arrangement tends to vary in response to the power being handled by the switching arrangement. A phase change energy or power transducing arrangement is thermally coupled to the switching arrangement and to the cooling arrangement, for absorbing heat from the switching arrangement when the instantaneous temperature of the switching arrangement tends to rise, and for releasing heat to the cooling arrangement when the instantaneous temperature of the switching arrangement tends to fall, thereby tending to maintain the temperature of the switching arrangement constant notwithstanding the variable power being handled.

In the context of an electric vehicle, the cooling system for the power switches may be sized or dimensioned to handle the average heat load, rather than the peak heat load, with concomitant cost and weight savings.

In another embodiment of the invention, the vehicle uses a phase-change heat sink or heat storage arrangement to absorb that portion of the heat produced in response to braking which cannot otherwise be used for recharging the battery or for heating of the passenger compartment. In a preferred embodiment of this version of the invention, the braking energy in the form of electrical energy or power is coupled to a resistance or resistive arrangement, for conversion of the energy into heat. A cooling system is coupled to the resistor. The physical arrangement of the resistor and the cooling system may be virtually identical with that described in conjunction with FIGS. 11a, 11b, and 11c, except that one or more resistors are mounted to the septa 1118a andor 118b, instead of the switches. In such an arrangement, the phase change heat sink or heat storage material 1116m is thermally coupled to the resistance generator for receiving excess braking energy, over and above the amount of heat carried away through air flow channels 1112 and 1114 of FIG. 11a. Since braking occurs only occasionally, the cooling system for the brake energy resistors can be dimensioned to transfer an average amount of heat which is less than the peak heating occasioned by hard braking.

What is claimed is:

1. A vehicle including:
   an electric traction drive machine;
   a source of electrical energy:
      an electrical device which receives fluctuating amounts of electrical energy from one of said traction drive machine and said source of electrical energy, and which is heated by said electrical energy, and which if not cooled may be damaged;
      a cooling system thermally coupled to said electrical device for cooling said electrical device by transfer of heat to the environment, said cooling system being dimensioned for transferring an average amount of the heat arising from said electrical energy, but not the peaks of said fluctuating amount; and
      phase-change heat storage material thermally coupled to said electrical device and to said cooling system, for absorbing excess heat from said electrical device during said peaks, and for transferring stored heat to said cooling system at times other than the times of said peaks.

2. A vehicle according to claim 1, wherein said electrical device comprises a switch controlled for coupling energy to said electric traction drive machine from said source of electrical energy.

3. A vehicle according to claim 1, wherein said electrical device is a resistor, coupled for converting vehicle braking energy into heat.

4. A vehicle including
   an electric traction drive machine;
   a source of electrical energy;
   a controllable switching arrangement coupled to said traction drive machine and to said source of electrical energy, for coupling energy between said source of electrical energy and said motor under the control of control signals;
   operator-controlled control means coupled to said switching arrangement, for controlling the amount of energy coupled between said source and said machine by synthesizing a current waveform;
   a cooling system coupled to said controllable switching arrangement, for transferring heat from said switching arrangement to ambient; and
   a phase change energy transducer coupled to said cooling system and to said switching arrangement, for transiently absorbing heat generated by said switching arrangement in excess of that which said cooling system can instantaneously trasfer.

5. An apparatus, comprising:
   an electrical machine:
      a source of electrical energy;
      controllable switching means coupled to said machine and to said source of electrical energy, for providing energy to said machine from said source in an amount which varies in time, whereby the energy handled by said switching means varies with time, and the power-loss-generated heat in said switching means also varies with time;
      cooling means coupled to said switching means, for transferring said heat from said switching means to ambient, whereby the instantaneous temperature of said switching means tends to vary in response to the power being handled by said switching means; and
      phase change energy transducing means thermally coupled to said switching means and to said cooling means, for absorbing heat from said switching means when said instantaneous temperature of said switching means tends to rise, and for releasing heat to said cooling means when said instantaneous temperature of said switching means tends to fall, thereby tending to maintain said temperature of said switching means constant.

* * * * *